United States Patent
Iwakuma et al.

(10) Patent No.: US 7,888,865 B2
(45) Date of Patent: Feb. 15, 2011

(54) ORGANIC ELECTROLUMINESCENT DEVICE AND DISPLAY HAVING MULTIPLE EMITTING LAYERS

(75) Inventors: Toshihiro Iwakuma, Sodegaura (JP); Masahide Matsuura, Sodegaura (JP); Hiroshi Yamamoto, Sodegaura (JP); Hisayuki Kawamura, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 776 days.

(21) Appl. No.: 10/574,179

(22) PCT Filed: Feb. 15, 2005

(86) PCT No.: PCT/JP2005/002266

§ 371 (c)(1),
(2), (4) Date: Mar. 30, 2006

(87) PCT Pub. No.: WO2005/091685

PCT Pub. Date: Sep. 29, 2005

(65) Prior Publication Data

US 2008/0246391 A1 Oct. 9, 2008

(30) Foreign Application Priority Data

Mar. 24, 2004 (JP) ............................. 2004-086905

(51) Int. Cl.
*H01L 51/52* (2006.01)

(52) U.S. Cl. ....................................... 313/506; 313/504

(58) Field of Classification Search ....................... None
See application file for complete search history.

(56) References Cited

FOREIGN PATENT DOCUMENTS

| EP | 1 595 933 A1 | 11/2005 |
|---|---|---|
| JP | 8-78163 | 3/1996 |
| JP | 2000-164359 | 6/2000 |
| JP | 2001-52870 | 2/2001 |
| JP | 2001-155864 | 6/2001 |
| JP | 2003-123971 | 4/2003 |
| JP | 2003-187977 | 7/2003 |
| JP | 2003-347064 | 12/2003 |
| WO | 03/059015 | 7/2003 |

OTHER PUBLICATIONS

Liu Zugang, Helena Nazare, White organic light-emitting diodes emitting from both hole and electron transport layers, Synthetic Metals, vols. 111-112, Jun. 1, 2000, pp. 47-51, ISSN 0379-6779, DOI: 10.1016/S0379-6779(99)00436-1. (http://www.sciencedirect.com/science/article/B6TY7-40F28V8-D/2/089ce8e47cb08c96280aa0140a32f661).*

(Continued)

*Primary Examiner*—Toan Ton
*Assistant Examiner*—Britt D Hanley
(74) *Attorney, Agent, or Firm*—Oblon, Spivak, McClelland, Maier & Neustadt, L.L.P.

(57) ABSTRACT

An organic electroluminescent device including at least an anode, a first emitting layer, a hole barrier layer, a second emitting layer and a cathode in this order. The first emitting layer and the second emitting layer both include a hole transporting material. The organic EL device is small in chromaticity change and has high efficiency.

10 Claims, 1 Drawing Sheet

OTHER PUBLICATIONS

U.S. Appl. No. 10/588,773, filed Aug. 8, 2006, Iwakuma, et al.
U.S. Appl. No. 11/480,465, filed Jul. 5, 2006, Iwakuma, et al.
U.S. Appl. No. 11/480,463, filed Jul. 5, 2006, Iwakuma, et al.
U.S. Appl. No. 10/588,223, filed Aug. 3, 2006, Matsuura, et al.
U.S. Appl. No. 11/480,919, filed Jul. 6, 2006, Matsuura, et al.
U.S. Appl. No. 10/588,549, filed Aug. 7, 2006, Matsuura, et al.
U.S. Appl. No. 11/498,071, filed Aug. 3, 2006, Matsuura, et al.
U.S. Appl. No. 11/512,110, filed Aug. 30, 2006, Matsuura, et al.
Tokito, Shizuo et al., "High-efficiency white phosphorescent organic light-emitting devices with greenish-blue and red-emitting layers", Applied Physics Letters, vol. 83, No. 12, pp. 2459-2461, 2003.
U.S. Appl. No. 12/037,511, filed Feb. 26, 2008, Kawamura, et al.
U.S. Appl. No. 10/590,076, filed Aug. 21, 2006, Kawamura, et al.
Vikram C. Sundar, et al., "Elastomeric Transistor Stamps: Reversible Probing of Charge Transport in Organic Crystals", Science, vol. 303, Mar. 12, 2004, pp. 1644-1646.
U.S. Appl. No. 12/755,240, filed Apr. 6, 2010, Iwakuma, et al.

* cited by examiner

ORGANIC ELECTROLUMINESCENT DEVICE AND DISPLAY HAVING MULTIPLE EMITTING LAYERS

TECHNICAL FIELD

The invention relates to an organic electroluminescent device (hereinafter referred to as organic-EL device). In particular, it relates to a white (white-light-emitting) organic EL device.

BACKGROUND ART

In recent years, white organic EL devices have been developed positively because they are usable for a mono-color display device, lighting such as backlighting, a full-color display device using a color filter and so on. Chromaticity change in a white organic EL device degrades its quality as a product, and furthermore it causes poor color reproducibility, for example, in a full-color display combined with a color filter. A white organic EL device with a small chromaticity change is thus desired.

There have been disclosed a number of methods to achieve white emission using organic EL materials. Few of the methods produce a white color using only one kind of emitting material; usually 2 to 3 kinds of emitting materials emit at the same time in single organic EL device. In case where three kinds of emitting materials are used, the combination of red, blue and green emission, which corresponds to the three primary colors, produce a white color. However, there is a problem that chromaticity control is difficult and the reproducibility is poor.

In case where two kinds of emitting materials are used, a blue emitting material and a yellow-to-red light emitting material, yellow-to-red being the complementary color of blue, are selected. However, the emission of yellow-to-red is often intensified to easily cause a change in color. In conventional white organic EL devices, for example, as shown in Reference Examples 1 and 2 of JP-A-2001-52870, blue light tends to easily weaken with a color change.

A white emission can also be obtained by doping with a blue dopant and a yellow-to-red dopant at the same time and adjusting their doping ratio. However red trends to intensify and, furthermore, energy easily transfers from blue to red, thereby yielding a white color tinged with red. In order to obtain a white color, it is necessary to use a yellow-to-red dopant at a very low concentration and reproducibility is therefore difficult to achieve.

There is a method in which a yellow-to-red material is doped into a hole-transporting layer adjacent to an emitting layer. In this method, since it is difficult to inject electrons into the hole-transporting layer, a red light is not strongly emitted, even though the yellow-to-red dopant tends to emit intensified light. Therefore, it is easy to balance blue emission and yellow-to-red emission to attain white emission. The method has an excellent luminous efficiency and long lifetime. However, it has a serious problem in that the chromaticity change is large after continuously driving or storage at high temperatures, which problem is caused by the distance dependency of energy transportation.

The inventors have found that the reason for chromaticity change is probably as follows: excited molecules for red emission are concentrated in an interface on the hole-transporting layer side. Balance between electrons and holes is lost by degeneration. Consequently even a small change in degree of concentration in the interface causes a large change in red emission but no large change in blue emission.

The type that divides an emitting layer into two layers includes the stacked type where an emitting layer near an anode is a yellow-to-red emitting layer, while an emitting layer near a cathode is a blue emitting layer. This type is excellent in efficiency. However, in order to obtain a white color, the thickness of the yellow-to-red emitting layer must be thinner than that of the blue emitting layer, or the concentration of a dopant in the yellow-to-red emitting layer must be smaller than that in the blue emitting layer to suppress yellow-to-red emission. Consequently fabricating the device is difficult. Specifically the thickness of the yellow-to-red emitting layer is often required to be about 1 to 2 nm for white emission. This thickness is as thin as the molecule size of ordinary low molecule type organic EL materials and controlling the thickness is thus extremely difficult.

On the other hand, by making an emitting layer on the anode side, toward which the emission region is liable to shift, a blue emitting layer, the tendency of the emitted light color to shift to red is counteracted, white light emission can be obtained and chromaticity change during driving is less, even when the yellow-to-red emitting layer is given a thickness of approximately 10 to 30 nm. However, in view of practical use, a stable white organic EL device is desired whose chromaticity change is even smaller.

Recently a white emission at a high efficiency is realized by using two phosphorescent emitting layers and arranging an exciton-blocking layer therebetween (refer to Applied Physics Letters, 83, 2459 (2003)). The exciton-blocking layer helps to block holes, but it has a large affinity level so that it traps electrons with an increased driving voltage of the device. It is thus required to use a hole-injecting material such as PEDOT.PSS (poly(3,4-ethylenedioxythiophen)/poly(styrenesulfonic acid)) which enables significantly low voltage.

An object of the invention is to provide an organic EL device which is small in chromaticity change and has high efficiency.

DISCLOSURE OF THE INVENTION

Focusing on the above-mentioned problems, the inventors found that an organic EL device small in chromaticity change with a high luminous efficiency can be obtained by forming a hole barrier layer between two emitting layers and causing emission of light at the interface between an emitting layer and hole barrier layer, thereby simplifying control of emitting region. The invention was accomplished based on this finding.

According to the invention, the following organic EL device and display can be provided.

1. An organic electroluminescent device comprising at least an anode, a first emitting layer, a hole barrier layer, a second emitting layer and a cathode in this order; wherein the first emitting layer and the second emitting layer both comprise a hole transporting material.

2. The organic electroluminescent device according to 1, wherein the first emitting layer and the second emitting layer both have a hole mobility of $10^{-5}$ cm$^2$/Vs or more.

3. The organic electroluminescent device according to 1 or 2, wherein the ionization potential of the hole barrier layer is higher than the ionization potential of the first emitting layer by 0.2 eV or more.

4. The organic electroluminescent device according to any one of 1 to 3, wherein a difference in affinity level between the hole barrier layer and the first emitting layer is 0.2 eV or less.

5. The organic electroluminescent device according to any one of 1 to 4, wherein a difference in affinity level between the hole barrier layer and the second emitting layer is 0.2 eV or less.

6. The organic electroluminescent device according to any one of 1 to 5, wherein the first emitting layer is a blue emitting layer.

7. The organic electroluminescent device according to any one of 1 to 6, wherein the second emitting layer is a yellow-to-red emitting layer.

8. The organic electroluminescent device according to any one of 1 to 5, wherein the first emitting layer is a yellow-to-red emitting layer.

9. The organic electroluminescent device according to any one of 1 to 5 and 8, wherein the second emitting layer is a blue emitting layer.

10. The organic electroluminescent device according to any one of 1 to 9 that emits white light.

11. A display comprising the organic electroluminescent device according to any one of 1 to 10.

The invention provides an organic EL device having a small chromaticity change and a high luminous efficiency, particularly, a white organic EL device.

BEST MODES FOR CARRYING OUT THE INVENTION

Embodiment 1

Figure 1:
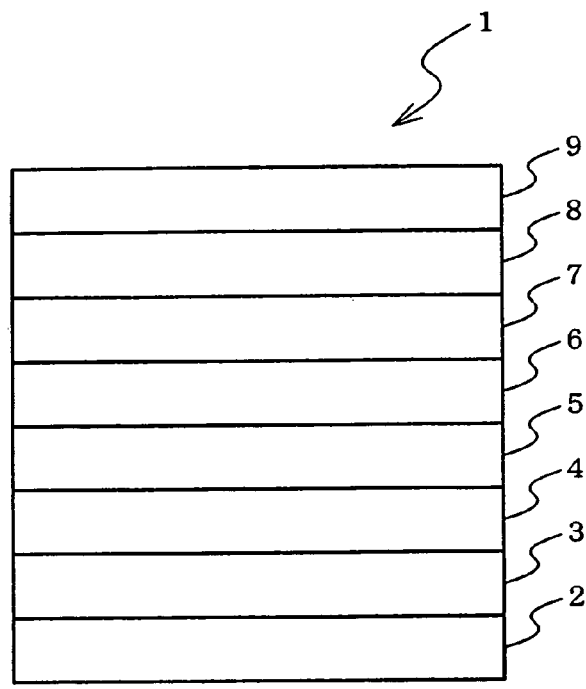
FIG. 1 is a view showing the structure of an organic EL device according to Embodiment 1.
Figure 2:
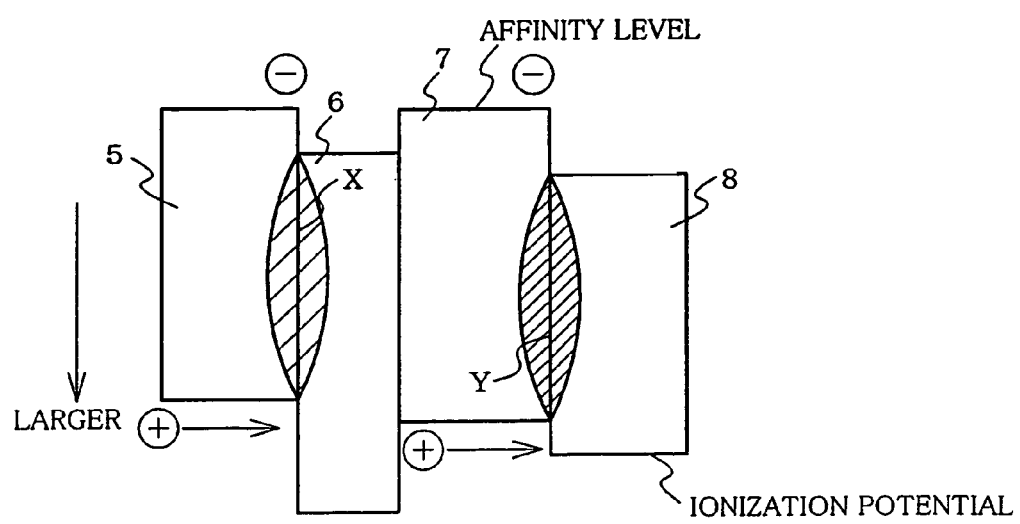
FIG. 2 is a view showing the energy levels of a first emitting layer, hole barrier layer, second emitting layer and electron transporting layer of Embodiment 1.

FIG. 1 is a view showing an organic EL device according to an embodiment of the invention. FIG. 2 is a view showing the energy levels of a first emitting layer, hole barrier layer, second emitting layer and electron transporting layer of this organic EL device.

As shown in FIG. 1, in an organic EL device 1, an anode 2, hole injection layer 3, hole transporting layer 4, first emitting layer 5, hole barrier layer 6, second emitting layer 7, electron transporting layer 8 and cathode 9 are stacked. The first emitting layer 5 and second emitting layer 7 are each made of hole transporting materials. Specifically, the first emitting layer 5 includes a first host material and a first dopant, and the second emitting layer 7 includes a second host material and a second dopant. The first host material and second host material both have a hole transporting property.

The "hole transporting property" means that overcurrent caused by hole transporting is observed by a known photocurrent technique.

The hole mobilities of the first emitting layer 5 and the second emitting layer 7 are each preferably $10^{-5}$ cm$^2$/Vs or more, more preferably $10^{-4}$ cm$^2$/Vs or more.

The hole mobility can be determined by Time of Fight technique and the like. In the case where a mobility is determined by Time of Flight technique, for example, TOF-301 (manufactured by OPTEL Co., Ltd.) and the like can be used, FIG. 2 is a view showing the energy levels of the first emitting layer 5, hole barrier layer 6, second emitting layer 7 and electron transporting layer 8 of the organic EL device 1. In this figure, the upper side represents an affinity level and the under side represents an ionization potential. In the energy level diagram, a lower portion exhibits a larger value.

The ionization potential of the hole barrier layer 6 is preferably larger than that of the emitting layer 5 by 0.2 eV or more. A difference in affinity level between the hole barrier layer 6, and the first emitting layer 5 and the second emitting layer 7 is preferably 0.2 eV or less. In FIG. 2, the affinity level of the hole barrier layer 6 is larger than those of the first emitting layer 5 and the second emitting layer 7. However, the above relationship may be in reverse.

In FIG. 2, holes transported from the anode 2 (not shown) through the hole injecting layer 3 (not shown) and the hole transporting layer 4 (not shown), are injected to the first emitting layer 5. The holes are localized at X around the hole barrier layer 6 since the hole barrier layer 6 constitutes a barrier. However, a part of the holes move through the hole barrier layer 6 into the second emitting layer 7. Almost of the holes moved do not move from the second emitting layer 7 into the electron transporting layer 8 and are localized at Y around the second emitting layer 7. On the other hand, electrons transported from the cathode 9 (not shown) through the electron transporting layer 8 are injected to the second emitting layer 7. The injected electrons recombine with the holes localized at X around the hole barrier layer 6 and Y around the second emitting layer 7. Therefore, the first emitting layer 5 and the second emitting layer 7 particularly emit in the regions X and Y.

This device 1 includes two emitting layers 5 and 7 interposed between the anode 2 and the cathode 9. Since the hole barrier layer 6 is provided between the two emitting layers, the two emission is easily controlled and the organic EL device is more stable.

This device 1 can emit light in various color by combining two emitting layers. In particular, white emission can be obtained by using the first emitting layer 5 as a blue emitting layer and the second emitting layer 7 as a yellow-to-red emitting layer; or the first emitting layer 5 as a yellow-to-red emitting layer and the second emitting layer 7 as a blue emitting layer, thereby yielding a white emission. It is preferred that the first emitting layer 5 is a yellow-to-red emitting layer and the second emitting layer 7 is a blue emitting layer.

The device described above which includes two emitting layers of blue emitting layer and yellow-to-red emitting layer, and a hole barrier layer provided therebetween is a white organic EL device with a small chromaticity change.

The device can spontaneously emit light at high efficiency by using a material having an affinity level similar to that of an emitting layer in a hole barrier layer.

The white organic EL device thus structured can emit more strongly in the interfaces between the emitting layers 5 and 7 and the hole barrier layer 6, and thus blue emission and yellow-to-red emission can be balanced for obtaining white emission. Consequently, it is not necessary that the thickness of one of emitting layers is extremely thin, or the concentration of a dopant is extremely small therein. Since the two emitting layers stably emit light, a chromaticity change becomes small.

This organic EL device has a practical luminous efficiency. It is suitably used for information displays, displays for automobiles, lighting devices and the like.

As mentioned above, in the organic EL device of the invention, the anode, the first emitting layer, the hole barrier layer, the second emitting layer and the cathode are stacked in this order. The hole barrier layer may be multiple layers. In the invention another organic layer or inorganic layer may be interposed between the anode and the first emitting layer, or the second emitting layer and the cathode. The materials of the interposed layers are not limited as long as they can transport electrons or holes and they are translucent.

The following exemplifies the preferred structure of white organic EL devices of the invention.

Anode/blue emitting layer (first emitting layer)/hole barrier layer/yellow-to-red emitting layer (second emitting layer)/cathode Anode/yellow-to-red emitting layer (first emitting layer)/hole barrier layer/blue emitting layer (second emitting layer)/cathode Anode/hole transporting layer/blue emitting layer (first emitting layer)/hole barrier layer/yellow-to-red emitting layer (second emitting layer)/cathode Anode/hole transporting layer/yellow-to-red emitting layer (first emitting layer)/hole barrier layer/blue emitting layer (second emitting layer)/cathode Anode/hole transporting layer/blue emitting layer (first emitting layer)/hole barrier layer/yellow-to-red emitting layer (second emitting layer)/electron transporting layer/cathode Anode/hole transporting layer/yellow-to-red emitting layer (first emitting layer)/hole barrier layer/blue emitting layer (second emitting layer)/electron transporting layer/cathode Anode/hole injecting layer/hole transporting layer/blue emitting layer (first emitting layer)/hole barrier layer/yellow-to-red emitting layer (second emitting layer)/electron transporting layer/cathode Anode/hole injecting layer/hole transporting layer/yellow-to-red emitting layer (first emitting layer)/hole barrier layer/blue emitting layer (second emitting layer)/electron transporting layer/cathode.

Anode/hole injecting layer/hole transporting layer/blue emitting layer (first emitting layer)/hole barrier layer/yellow-to-red emitting layer (second emitting layer)/electron transporting layer/electron injecting layer/cathode Anode/hole injecting layer/hole transporting layer/yellow-to-red emitting layer (first emitting layer)/hole barrier layer/blue emitting layer (second emitting layer)/electron transporting layer/electron injecting layer/cathode A blue emitting layer, a yellow-to-red emitting layer and a hole barrier layer, characteristic features of the invention, will be mainly described below. The structures and fabrication of other organic layers, inorganic compound layers, anodes, cathodes and so on will be described briefly since they can have general structures.

1. Emitting Layer (1) Blue Emitting Layer

A blue emitting layer is preferably an emitting layer which emits light with a maximum wavelength of 450 to 500 nm and preferably made of a hole-transporting host material and a blue dopant. The host material is preferably a styryl derivative, arylene derivative or aromatic amine. The styryl derivative is particularly preferably at least one kind selected from distyryl, tristyryl, tetrastyryl and styryl amine derivatives. The arylene derivative is particularly preferably an anthracene derivative, especially a compound containing an arylanthracene structure. The aromatic amine is preferably a compound containing 2 to 4 nitrogen atoms substituted with an aromatic group, particularly preferably a compound containing 2 to 4 nitrogen atoms substituted with an aromatic group and at least one alkenyl group.

The styryl and anthracene derivatives include compounds represented by the following formulas [1] to [6] and the aromatic amines include compounds represented by the following formulas [7] to [8].

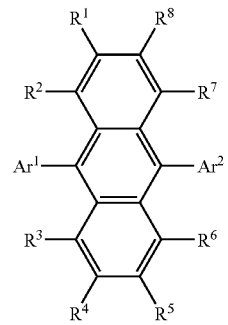

[1]

wherein $R^1$ to $R^8$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; and $Ar^1$ and $Ar^2$ are independently a substituted or unsubstituted aryl group with 6 to 30 carbon atoms or a substituted or unsubstituted alkenyl group, a substituent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms.

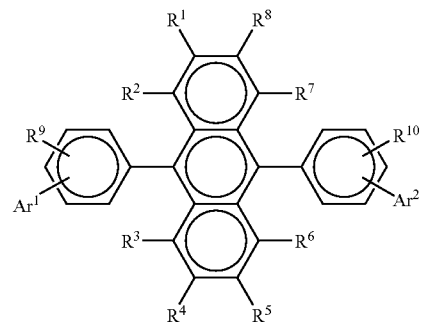

[2]

wherein $R^1$ to $R^{10}$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; $Ar^1$ and $Ar^2$ are independently a substituted or unsubstituted aryl group with 6 to 30 carbon atoms or a substituted or unsubstituted alkenyl group; and the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted heterocyclic group with 5 to 30 carbon atoms.

[3]

wherein $R^1$ to $R^{10}$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; $Ar^3$ and $Ar^4$ are independently a substituted or unsubstituted aryl group with 6 to 30 carbon atoms or a substituted or unsubstituted alkenyl group; the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms, a substituted or unsubstituted heterocyclic group with 5 to 30 carbon atoms or a substituted or unsubstituted alkenyl group with 4 to 40 carbon atoms; l is 1 to 3, m is 1 to 3 and l+m is 2 or more.

[4]

wherein $R^1$ to $R^8$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted heterocyclic group with 5 to 30 carbon atoms; $Ar^3$ and $Ar^4$ are independently a substituted or unsubstituted aryl group with 6 to 30 carbon atoms or a substituted or unsubstituted alkenyl group; and the substitutent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms, a substituted or unsubstituted heterocyclic group with 5 to 30 carbon atoms or a substituted or unsubstituted alkenyl group with 4 to 40 carbon atoms.

[5]

wherein $R^{11}$ to $R^{20}$ are independently a hydrogen atom, an alkenyl group, an alkyl group, a cycloalkyl group an aryl group, an alkoxy group, an aryloxy group, an alkylamino group, an arylamino group or a substitutable heterocyclic group; a and b are each an integer of 1 to 5; when they are 2 or more, $R^{11}$s or $R^{12}$s may be the same as or different from each other, or $R^{11}$s or $R^{12}$s may be bonded together to form a ring; $R^{13}$ and $R^{14}$, $R^{15}$ and $R^{16}$, $R^{17}$ and $R^{18}$, or $R^{19}$ and $R^{20}$ may be bonded together to form a ring; and $L^1$ is a single bond, —O—, —S—, —N(R)—(R is an alkyl group or a substitutable aryl group) or an arylene group.

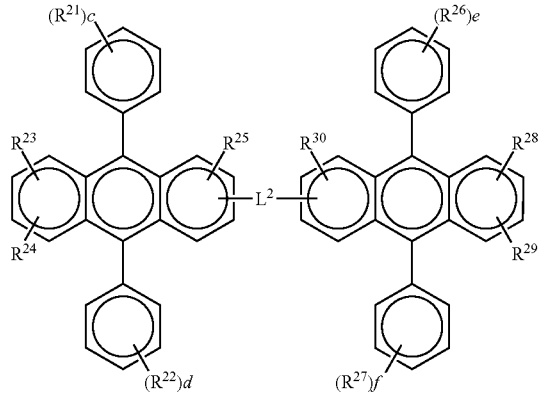

[6]

wherein $R^{21}$ to $R^{30}$ are independently a hydrogen atom, an alkenyl group, an alkyl group, a cycloalkyl group an aryl group, an alkoxy group, an aryloxy group, an alkylamino group, an arylamino group or a substitutable heterocyclic group; c, d, e and f are each an integer of 1 to 5; when they are 2 or more, $R^{21}$s, $R^{22}$s, $R^{26}$s or $R^{27}$s may be the same as or different from each other, $R^{21}$s, $R^{22}$s, $R^{26}$s or $R^{27}$s may be bonded together to form a ring, or $R^{23}$ and $R^{24}$ or $R^{28}$ and $R^{29}$ may be bonded together to form a ring; and $L^2$ is a single bond, —O—, —S—, —N(R)—(R is an alkyl group or a substitutable aryl group) or an arylene group.

[7]

$$Ar^5 \!-\!\!\left(\!\!N\!\!\begin{array}{c}Ar^6\\ \\Ar^7\end{array}\!\!\right)_{\!g}$$

wherein $Ar^5$, $Ar^6$ and $Ar^7$ are independently a substituted or unsubstituted monovalent aromatic group with 6 to 40 carbon atoms or a styryl group and g is an integer of 1 to 4.

[8]

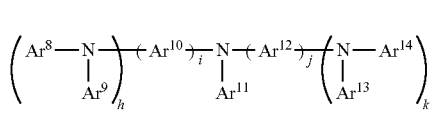

wherein $Ar^8$, $Ar^9$, $Ar^{11}$, $Ar^{13}$ and $Ar^{14}$ are independently a substituted or unsubstituted monovalent aromatic group with 6 to 40 carbon atoms or a styryl group, $Ar^{10}$ and $Ar^{12}$ are independently a substituted or unsubstituted divalent aromatic group with 6 to 40 carbon atoms or a styrylene group, h and k are each an integer of 0 to 2 and i and j are each an integer of 0 to 3.

A blue dopant is preferably a styrylamine, an amine-substituted styryl compound or a compound containing fused aromatic rings. A blue dopant may comprise multiple kinds of compounds.

Examples of the above-mentioned styryl amines and amine-substituted styryl compounds are compounds represented by the general formulas [9] to [10] and examples of the above-mentioned compounds containing fused aromatic rings are compounds represented by the general formula [11].

[9]

$$Ar^5 \!-\!\!\left(\!\!N\!\!\begin{array}{c}Ar^6\\ \\Ar^7\end{array}\!\!\right)_{\!p}$$

wherein $Ar^5$, $Ar^6$, and $Ar^7$ are independently a substituted or unsubstituted aromatic group with 6 to 40 carbon atoms or a styryl group and p is an integer of 1 to 3.

[10]

$$U\text{-}Ar^{15}\!\!-\!\!\left(\!\!\begin{array}{c}C=C\\|\ \ |\\E^1\ E^2\end{array}\!\!-\!\!Ar^{16}\!\!\right)_{\!q}\!\!-\!\!V$$

wherein $Ar^{15}$ and $Ar^{16}$ are independently an arylene group with 6 to 30 carbon atoms; $E^1$ and $E^2$ are independently an aryl or alkyl group with 6 to 30 carbon atoms, a hydrogen atom, or a cyano group; q is an integer of 1 to 3; U and/or V are a substituent including an amino group and the amino group is preferably an arylamino group.

$(A)_r\text{-}B$ [11]

wherein A is an alkyl group or an alkoxy group with 1 to 16 carbon atoms, a substituted or unsubstituted aryl group with 6 to 30 carbon atoms, a substituted or unsubstituted alkylamino with 6 to 30 carbon atoms, a substituted or unsubstituted arylamino with 6 to 30 carbon atoms and B is a fused aromatic ring group with 10 to 40 carbon atoms; and r is an integer of 1 to 4.

As a blue emitting layer, an emitting layer containing a phosphorescent compound can be used. A host material is preferably a compound containing a carbazole ring. Specific examples are shown below.

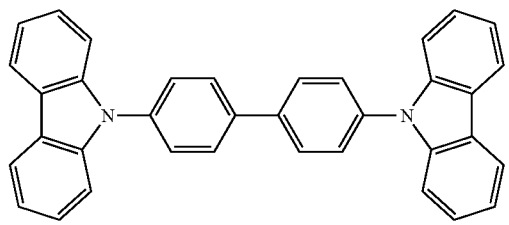

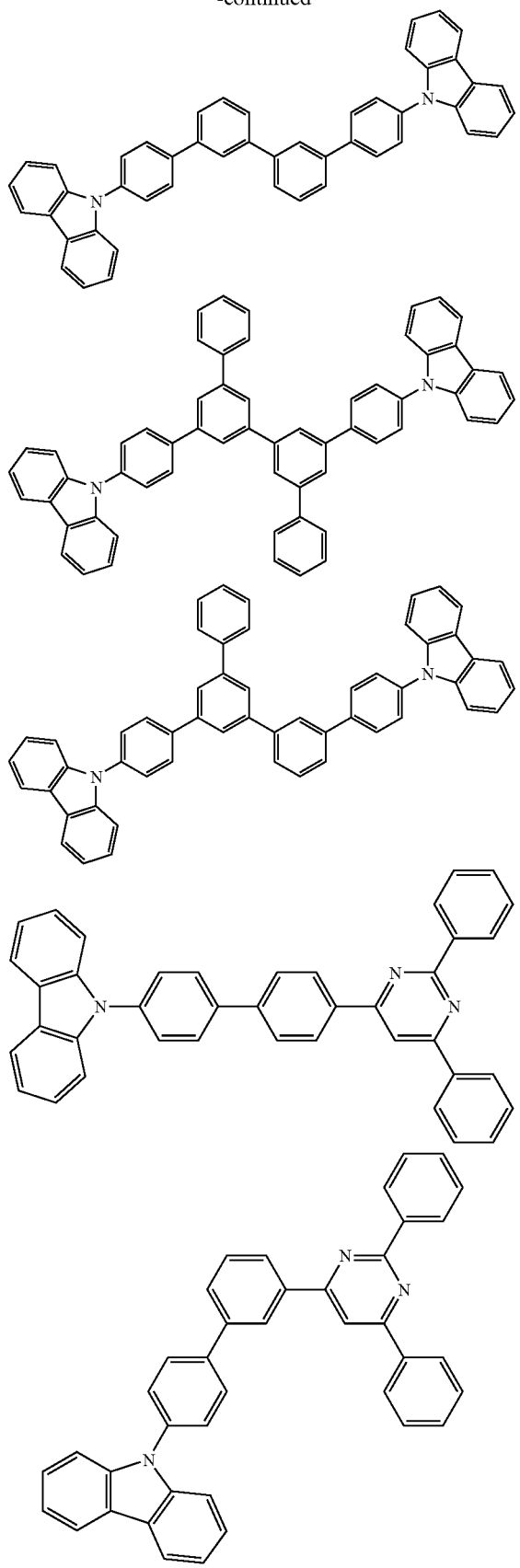

Examples of the host compounds suitable for phosphorescence emission include, triazole, oxazole, oxadiazole, imidazole, polyarylalkane, pyrazoline, pyrazolone, phenylanediamine, arylamine, amino-substituted calcone, styryl anthracene, fluorenone, hydrazone, stilbene and silazane derivatives; aromatic tertiary amine, styrylamine, aromatic dimethylidene and porphyrin compounds; anthraquinodimethane, anthrone, diphenylquinone, thiopyrandioxide, carbodiimide, fluoreniridenemethane and distyrylpyrazine derivatives; hetrocyclic tetracarboxylic anhydrides such as naphthaleneperylene; phthalocyanine derivatives; metal complexes of 8-quinolinol derivatives, various metal complex polysilane compounds represented by metal complexes having metalphthalocyanine, benzoxazole or benzothiaole as a ligand; electroconductive polymer oligomers such as poly (N-vinylcarbazole) derivatives, aniline copolymers, thiophene oligomers and polythiophene; and polymer compounds such as polythiophene, polyphenylene, polyphenylenevinylene and polyfluorene derivatives. Host compounds can be used individually or as a combination of two or more kinds.

A phosphorescent dopant is a compound that can emit light from triplet excitons. The dopant is not limited as long as it can emit light from triplet excitons, but it is preferably a metal complex containing at least one metal selected from the group of Ir, Ru, Pd, Pt, Os and Re. A porphyrin metal complex or an ortho-metalated metal complex is preferable. As a porphyrin metal complex, a porphyrin platinum complex is preferable. The phosphorescent compounds can be used individually or as a combination of two or more kinds. There are various ligands forming an ortho-metalated metal complex. Preferable ligands include 2-phenylpyridine, 7,8-benzoquinoline, 2-(2-thienyl)pyridine, 2-(1-naphtyl)pyridine and 2-phenylquinoline derivatives. These derivatives can contain substituents if necessary. Fluorides and derivatives containing a trifluoromethyl group are particularly preferable as a blue dopant. As an auxiliary ligand, preferred are ligands other than the above-mentioned ligands, such as acetylacetonate and picric acid may be contained. The phosphorescent dopants can be used individually or as a combination of two or more kinds.

The content of a phosphorescent dopant in an emitting layer is not limited and can be properly selected according to purposes; for example, it is 0.1 to 70 mass %, preferably 1 to 30 mass %. When the content of a phosphorescent compound is less than 0.1 mass %, emission may be weak and the advantages thereof may not be sufficiently obtained. When the content exceeds 70 mass %, the phenomenon called concentration quenching may significantly proceed, thereby degrading the device performance.

An emitting layer may contain a hole-transporting material, electron-transporting material or polymer binder if necessary.

The thickness of a blue emitting layer is preferably from 5 to 50 nm, more preferably from 7 to 50 nm and most preferably from 10 to 50 nm. When it is less than 5 nm, the formation of an emitting layer and the adjustment of chromaticity may become difficult. When it exceeds 50 nm, the driving voltage may increase.

(2) Yellow-to-Red Emitting Layer

The yellow-to-red emitting layer is preferably a layer which emits light with a maximum wavelength of 540 to 700 nm; and preferably made of a host material and a yellow-to-red dopant. Examples of the host material are preferably styryl derivatives, anthracene derivatives, aromatic amines, and metal complexes of 8-hydroxyquinoline or its derivatives. As an example of the styryl derivatives, anthracene derivatives and aromatic amines, host materials used for a blue emitting layer can also be used for a yellow-to-red emitting layer. As an example of the metal complexes of 8-hydroxyquinoline or its derivatives, metal chelate oxynoide compounds including chelates of oxine (generally 8-quinolinol or 8-hydroxyquinoline), such as tris(8-quinolinol)aluminum, can be used. When a compound with a high electron transporting property such as anthracene derivatives is used as a host material, host materials for a blue emitting layer and a yellow-to-red emitting layer may be the same or different.

There can be used as a yellow-to-red dopant florescent compound containing at least one of a fluoranthene skeleton and a perylene skeleton. Examples include compounds represented by the following general formulas [12] to [28].

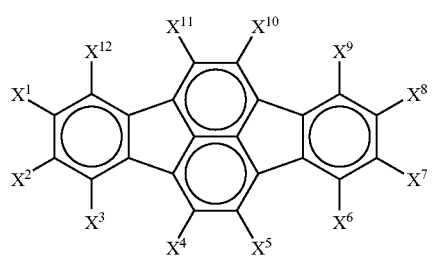

[12]

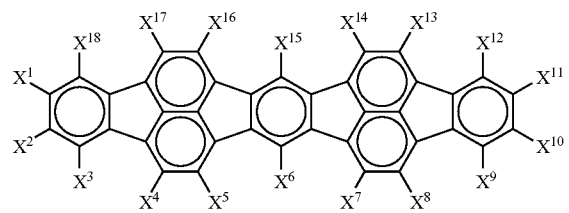

[13]

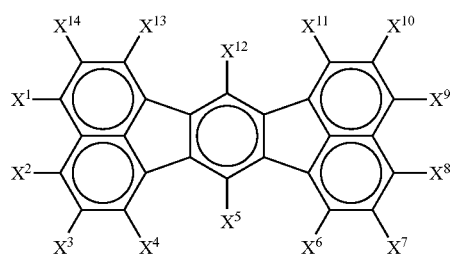

[14]

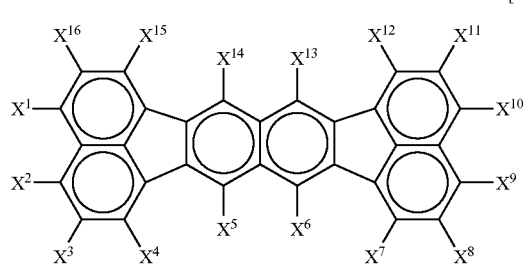

[15]

-continued

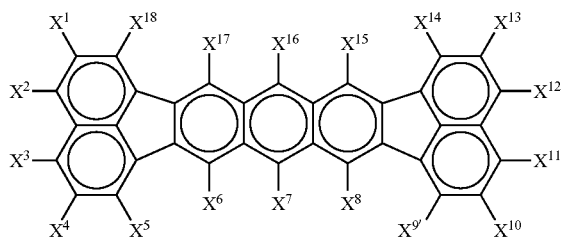

[16]

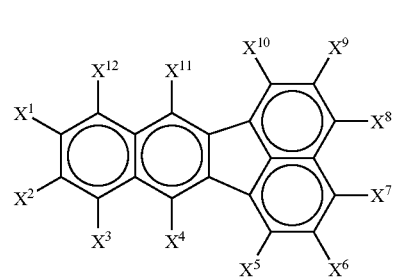

[17]

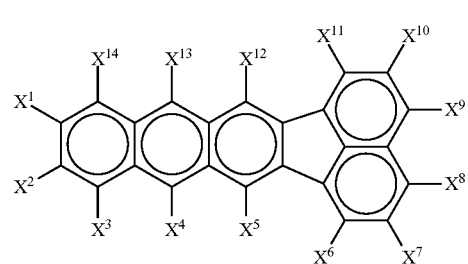

[18]

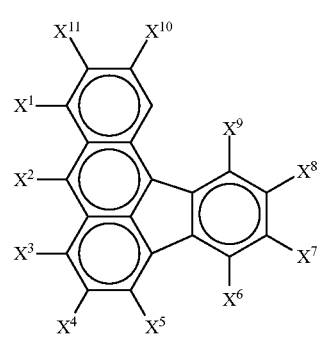

[19]

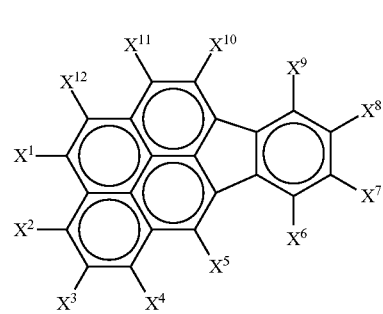

[20]

[21]

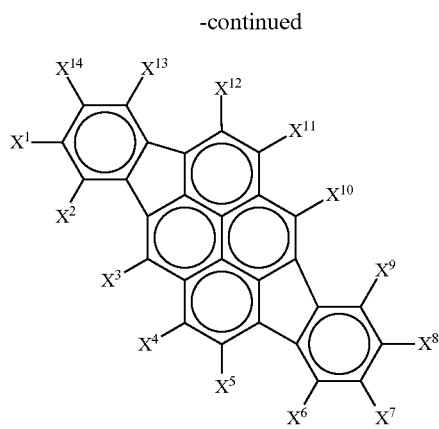

[22]

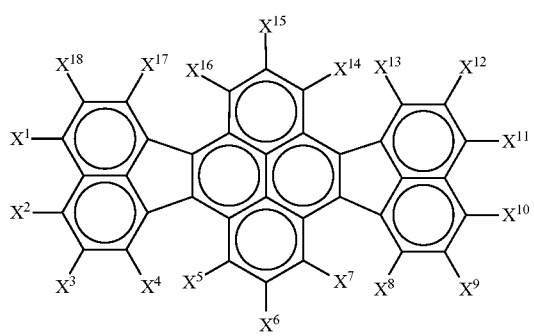

[23]

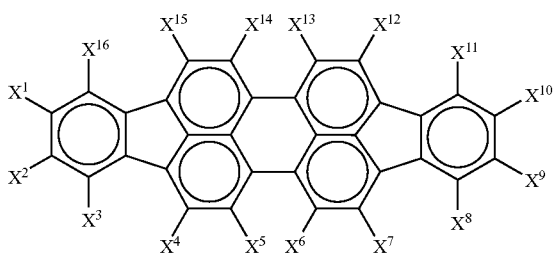

[24]

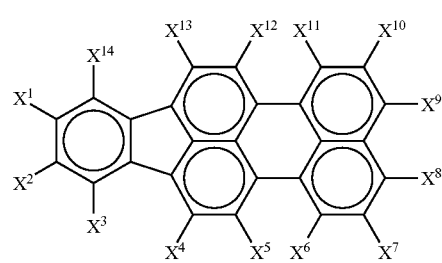

[25]

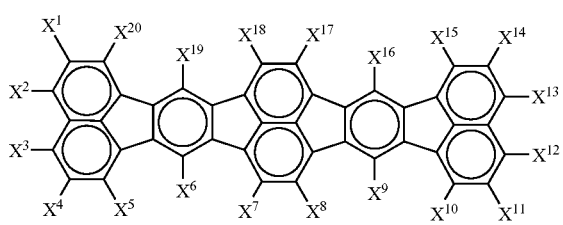

[26]

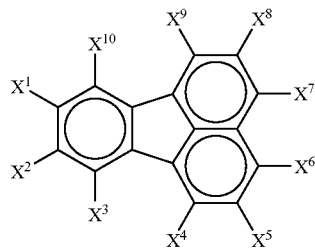

wherein $X^1$ to $X^{20}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^1$ to $X^{20}$ may be bonded together to form a ring structure; and when adjacent substituents are an aryl group, the substituents may be the same.

The compounds represented by the general formulas [12] to [26] preferably contain an amino group or an alkenyl group.

[27]

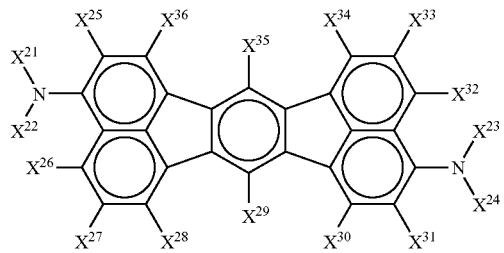

[28]

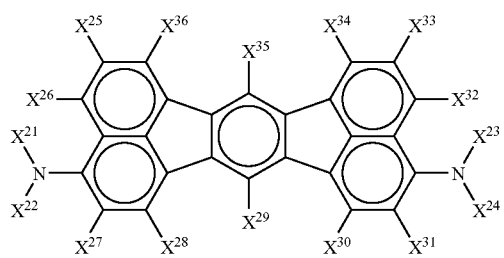

wherein $X^{21}$ to $X^{24}$ are independently an alkyl group with 1 to 20 carbon atoms, a substituted or unsubstituted aryl group with 6 to 30 carbon atoms; $X^{21}$ and $X^{22}$ and/or $X^{23}$ and $X^{24}$ may be bonded to each other with a carbon to carbon bond, —O— or —S— therebetween; $X^{25}$ to $X^{36}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^{25}$ to $X^{36}$ may be bonded together to form a ring structure; and at least one of the substituents $X^{25}$ to $X^{36}$ in each of the formulas preferably contain an amine or alkenyl group.

A florescent compound containing a fluoranthene skeleton preferably contains an electron-donating group for high performance and long lifetime. A preferable electron-donating group is a substituted or unsubstituted arylamino group. A fluorescent compound containing a fluoranthene skeleton preferably has 5 or more fused rings, more preferably 6 or more fused rings, for the following reason. The fluorescent compound has a fluorescent peak wavelength of 540 to 700 nm thereby exhibiting a high white purity.

For a yellow-to-red emitting layer, a phosphorescent compound can be used. A preferred phosphorescent compound is a compound that is a host material containing a carbazole ring and the compounds used for a blue emitting layer can be used. A dopant is a compound that can emit from triplet excitons. The dopant is not limited as long as it can emit from triplet excitons but it is preferably a metal complex containing at least one metal selected from the group of Ir, Ru, Pd, Pt, Os and Re. A porphyrin metal complex or an ortho-metalated metal complex is preferable. There are various ligands forming an ortho-metalated metal complex. Preferable ligands include 2-phenylpyridine, 7,8-benoquinoline, 2-(1-naphtyl) pyridine and 2-phenylquinoline derivatives. These derivatives can contain substituents if necessary. Preferred are 2-phenylquinoline derivatives, 2-(2-thienyl)pyridine derivatives and the like as a yellow-to-red dopant. Ligands other than the above-mentioned ligands, such as acetylacetonate and picric acid, may be contained as an auxiliary ligand.

The content of a phosphorescent dopant in an emitting layer is not limited and can be properly selected according to purposes; for example, it is 0.1 to 70 mass %, preferably 1 to 30 mass %. When the content of a phosphorescent compound is less than 0.1 mass %, emission may be weak and the advantages thereof may not be sufficiently obtained. When the content exceeds 70 mass %, the phenomenon called concentration quenching may significantly proceed, thereby degrading the device performance.

The thickness of a yellow-to-red emitting layer is preferably from 10 to 50 nm, more preferably from 20 to 50 nm and most preferably from 30 to 50 nm. When it is less than 10 nm, the luminous efficiency may decrease. When it exceeds 50 nm, the driving voltage may increase.

2. Hole Barrier Layer

A hole barrier layer is a layer for restricting the injection of holes from a first layer into a second layer to adjust an emission amount from each emitting layer.

Various organic compounds and inorganic compounds are used for the barrier layer so long as the ionization potentials of the compounds are larger than that of the first emitting layer.

Specifically, the material of the hole barrier layer includes compounds containing a nitrogen-containing heterocyclic ring and metal complexes. The compounds containing a nitrogen-containing heterocyclic ring include oxadiazole derivatives, triazole derivatives, phenanthroline derivatives, and metal complexes of 8-hydroxyquinoline or derivatives thereof.

The thickness of the hole barrier layer is preferably from 1 to 30 nm, more preferably from 1 to 20 nm. When the thickness exceeds 30 nm, a driving voltage may increase. When the thickness is below 1 nm, the hole barrier layer may not restrict the injection of holes.

3. Other Organic Layers (1) First Organic Layer

A hole-injecting layer, a hole-transporting layer, an organic semiconductor layer and the like can be arranged between the anode and the first emitting layer as a first organic layer. The hole-injecting layer or the hole-transporting layer is a layer for helping the injection of holes into the emitting layer so as to transport holes to an emitting region. The hole mobility thereof is large and the ionization energy thereof is usually as small as 5.5 eV or less. A hole-injecting layer is formed to control energy level, for example, to reduce rapid energy level changes. Such a hole-injecting, transporting layer is preferably made of a material which can transport holes to the emitting layer at a low electric field intensity. The hole mobility thereof is preferably at least $10^{-6}$ cm$^2$/V·second when an electric field of, e.g., $10^4$ to $10^6$ V/cm is applied. The material for forming the hole-injecting layer or the hole-transporting layer can be arbitrarily selected from materials which have been widely used as a material transporting electric charge of holes in photoconductive materials and known materials used in a hole-injecting layer of organic EL devices.

As materials for a hole-injecting layer and a hole-transporting layer, specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The above-mentioned substances can be used as the material of the hole-injecting layer or the hole-transporting layer. The following can also be used: porphyrin compounds (disclosed in JP-A-63-2956965 and others), aromatic tertiary amine compounds, styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), and the aromatic tertiary amine compounds. The following can also be given as examples: 4,4'-bis(N-(1-naphthyl)-N-phenylamino)biphenyl, which has in the molecule thereof two condensed aromatic rings, disclosed in U.S. Pat. No. 5,061,569, and 4,4',4"-tris(N-(3-methylphenyl)-N-phenylamino)tri-phenylamine, wherein three triphenylamine units are linked to each other in a star-burst form, disclosed in JP-A-4-308688. In addition to aromatic dimethylidene type compounds mentioned above as the material for an emitting layer, inorganic compounds such as p-type Si and p-type SiC can also be used as the material for the hole-injecting layer or the hole-transporting layer.

This hole-injecting layer or the hole-transporting layer may be a single layer made of one or more of the above-mentioned materials. The hole-injecting layers or hole-transporting layers made of compounds different from each other may be stacked.

The thickness of the hole-injecting layer or hole-transporting layer is not particularly limited, and is preferably from 20 to 200 nm.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomers such as thiophene-containing oligomers, or arylamine-containing oligomers disclosed in JP-A-8-193191, and electroconductive dendrimers such as arylamine-containing dendrimers.

The thickness of the organic semiconductor layer is not particularly limited, and is preferably from 10 to 1,000 nm.

(2) Second Organic Layer

An electron-injecting layer, an electron-transporting layer and the like can be arranged between a cathode and a second emitting layer as a second organic layer. The electron-injecting layer or the electron-transporting layer is a layer for helping the injection of electrons into the emitting layer, and has a large electron mobility. The electron-injecting layer is formed to control energy level, for example, to reduce rapid energy level changes.

The thickness of the electron-transporting layer is optionally selected several nanometers to several micrometers. However, the thickness is preferably selected such that when an electric field of $10^4$ to $10^6$ V/cm is applied, the electron mobility becomes $10^{-5}$-cm$^2$/Vs or more. The electron mobility can be measured by the same method as the hole mobility measurement.

The material used in the electron-injecting layer or the electron-transporting layer is preferably a metal complex of 8-hydroxyquinoline or a derivative thereof, or oxadiazole derivatives.

Specific examples of the metal complex of 8-hydroxyquinoline or derivatives thereof include metal chelate oxynoid compounds containing a chelate of oxine (generally, 8-quinolinol or 8-hydroxyquinoline). For example, tris (8-quinolinol) aluminum (Alq) described in the explanation of the emitting material can be used.

Examples of the oxadiazole derivatives include electron transporting compounds represented by the following general formulas [29] to [31]:

[29]

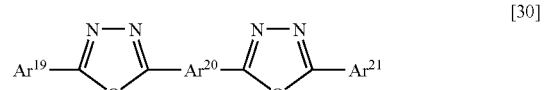

[30]

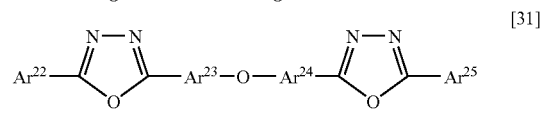

[31]

wherein Ar$^{17}$, Ar$^{18}$, Ar$^{19}$, Ar$^{21}$, Ar$^{22}$ and Ar$^{25}$ may be the same or different and each represent a substituted or unsubstituted aryl group; and Ar$^{20}$, Ar$^{23}$ and Ar$^{24}$ may be the same or different and each represent a substituted or unsubstituted arylene group.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbon atoms, alkoxy groups with 1 to 10 carbon atoms, and a cyano group. The electron-transporting compounds are preferably ones from which a thin film can be easily formed.

Specific examples of the electron-transporting compounds are as follows.

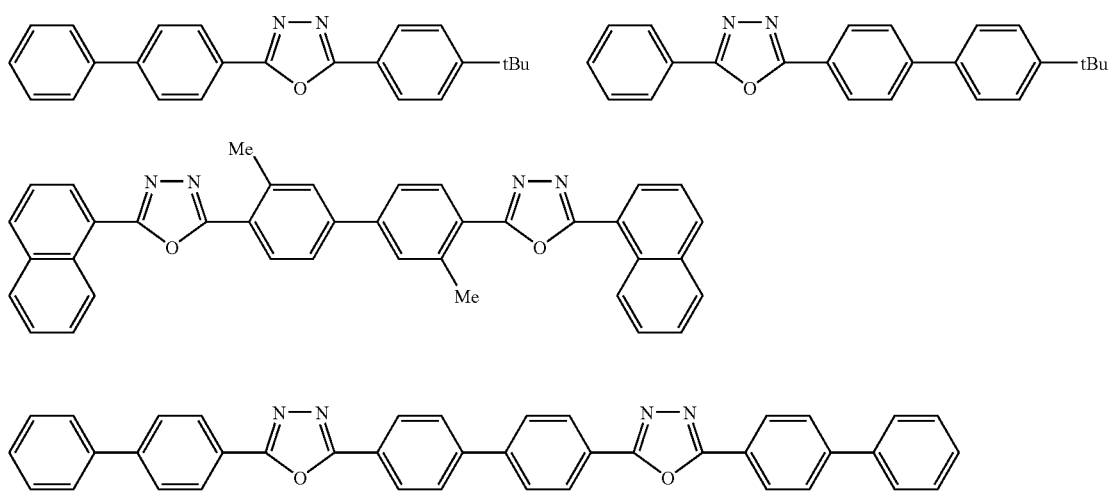

-continued

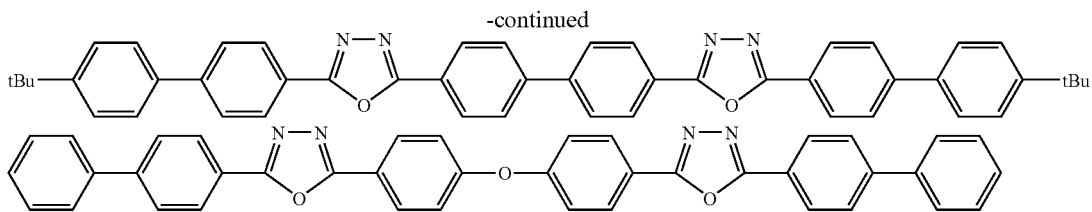

Nitrogen-containing hetero cyclic compounds represented by the following formulas

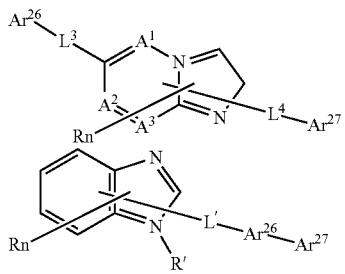

wherein $A^1$ to $A^3$ is a nitrogen atom or carbon atom; R and R' are an aryl group which has 6 to 60 carbon atoms and may have a substituent, a heteroaryl group which has 3 to 60 carbon atoms and may have a substituent, an alkyl group which has 1 to 20 carbon atoms, a haloalkyl group which has 1 to 20 carbon atoms, or an alkoxy group which has 1 to 20 carbon atoms; n is an integer of 0 to 5 and when n is an integer of 2 or more, Rs may be the same as or different from each other or adjacent Rs may be bonded to each other to form a substituted or unsubstituted carbocyclic aliphatic ring or a substituted or unsubstituted carbocyclic aromatic ring; $Ar^{26}$ is an aryl group which has 6 to 60 carbon atoms and may have a substituent, or a heteroaryl group which has 3 to 60 carbon atoms and may have a substituent; $Ar^{27}$ is a hydrogen atom, an alkyl group which has 1 to 20 carbon atoms, a haloalkyl group which has 1 to 20 carbon atoms, an alkoxy group which has 1 to 20 carbon atoms, an aryl group which has 6 to 60 carbon atoms and may have a substituent, or a heteroaryl group which has 3 to 60 carbon atoms and may have a substituent (provided that either one of $Ar^{26}$ and $Ar^{27}$ is a condensed cyclic group which has 10 to 60 carbon atoms and may have a substituent or a condensed heterocyclic group which has 3 to 60 carbon atoms and may have a substituent); $L^3$, $L^4$ and $L'$ are each a single bond, a condensed cyclic group which has 6 to 60 carbon atoms and may have a substituent, a condensed heterocyclic group which has 3 to 60 carbon atoms and may have a substituent, or a fluorenylene group which may have a substituent.

Nitrogen-containing cyclic compounds represented by the following formulas

HAr-$L^5$-$Ar^{28}$—$Ar^{29}$ wherein HAr is a nitrogen-containing heterocyclic ring which has 3 to 40 carbon atoms and may have a substituent, $L^5$ is a single bond, an arylene group which has 6 to 60 carbon atoms and may have a substituent, a heteroarylene group which has 3 to 60 carbon atoms and may have a substituent, or a fluorenylene group which may have a substituent, $Ar^{28}$ is a bivalent aromatic hydrocarbon group which has 6 to 60 carbon atoms and may have a substituent, $Ar^{29}$ is an aryl group which has 6 to 60 carbon atoms and may have a substituent or a heteroaryl group which has 3 to 60 carbon atoms and may have a substituent.

An EL device using a silacyclopentadiene derivative represented by the following formula, disclosed in JP-A-09-087616

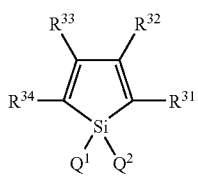

wherein $Q^1$ and $Q^2$ are each a saturated or unsaturated hydrocarbon group with 1 to 6 carbon atoms, an alkoxy group, an alkenyloxy group, an alkynyloxy group, a hydroxyl group, a substituted or unsubstituted aryl group, or a substituted or unsubstituted heterocyclic group, or $Q^1$ and $Q^2$ are bonded to each other to form a substituted or unsubstituted ring; $R^{31}$ to $R^{34}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or a structure formed by condensing adjacent substituted or unsubstituted rings.

Silacyclopentadiene derivatives represented by the following formula, disclosed in JP-A-09-194487

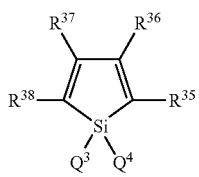

wherein $Q^3$ and $Q^4$ are each a saturated or unsaturated hydrocarbon group with 1 to 6 carbon atoms, an alkoxy group, an alkenyloxy group, an alkynyloxy group, a substituted or unsubstituted aryl group, or a substituted or unsubstituted heterocyclic group, or $Q^3$ and $Q^4$ are bonded to each other to form a substituted or unsubstituted ring; $R^{35}$ to $R^{38}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or a substituted or unsubstituted condensed ring structure formed by adjacent substituents of $R^{35}$ to $R^{38}$: however, in the case where $R^{35}$ and $R^{38}$ are a phenyl group, $Q^3$ and $Q^4$ are each neither an alkyl group nor a phenyl group; in the case where $R^{35}$ and $R^{38}$ are a thienyl group, $Q^3$, $Q^4$, $R^{36}$ and $R^{37}$ do not form the structure where $Q^3$ and $Q^4$ are a monovalent hydrocarbon group, and at the same time $R^{36}$ and $R^{37}$ are an alkyl group, an aryl group, an alkenyl group, or an aliphatic group with a ring formed by $R^{36}$ and $R^{37}$ bonded; in the case where $R^{35}$ and $R^{38}$ are a silyl group, $R^{36}$, $R^{37}$, $Q^3$ and $Q^4$ are each neither a monovalent hydrocarbon group with 1 to 6 carbon atoms nor a hydrogen atom; and in the case where $R^{35}$ and $R^{36}$ are bonded to each other to form a condensed structure with a benzene ring, $Q^3$ and $Q^4$ are neither an alkyl group nor a phenyl group.

Borane derivatives represented by the following formula, disclosed in JP-A1-2000-040586

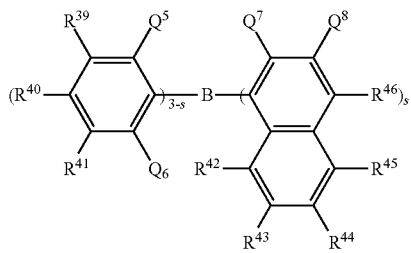

wherein $R^{39}$ to $R^{46}$ and $Q^8$ are each a hydrogen atom, a saturated or unsaturated hydrocarbon group, an aromatic group, a heterocyclic group, a substituted amino group, a substituted boryl group, an alkoxy group or an aryloxy group; $Q^5$, $Q^6$ and $Q^7$ each represent a saturated or unsaturated hydrocarbon group, an aromatic group, a heterocyclic group, a substituted amino group, an alkoxy group or an aryloxy group; the substituent of $Q^7$ and $Q^8$ may be bonded to each other to form condensed rings; s is an integer of 1 to 3, and $Q^7$s may be different from each other when s is 2 or more; provided that excluded are the compounds where s is 1, $Q^5$, $Q^6$ and $R^{40}$ are a methyl group and $R^{46}$ is a hydrogen atom or substituted boryl group, and the compounds where s is 3 and $Q^7$ is a methyl group.

Compounds represented by the following formula, disclosed in JP-A-10-088121

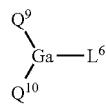

wherein $Q^9$ and $Q^{10}$ are independently a ligand represented by the following formula (1); and $L^6$ is a halogen atom, a substituted or unsubstituted alkyl group, a substituted or unsubstituted cycloalkyl group, a substituted or unsubstituted aryl group, a substituted or unsubstituted heterocyclic group, —$OR^{47}$ wherein $R^{47}$ is a hydrogen atom, a substituted or unsubstituted alkyl group, a substituted or unsubstituted cycloalkyl group, a substituted or unsubstituted aryl group, a substituted or unsubstituted heterocyclic group, or —O—Ga-$Q^{11}$ ($Q^{12}$) wherein $Q^{11}$ and $Q^{12}$ are the same legand as $Q^9$ and $Q^{10}$.

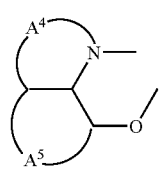

(1)

wherein rings $A^4$ and $A^5$ form a substituted or unsubstituted structure where 6-membered aryl rings are condensed.

The metal complexes have the strong nature of an n-type semiconductor and large ability of injecting electrons. Further the energy generated at the time of forming a complex is small and a metal is then strongly bonded to ligands in the complex formed with a large fluorescent quantum efficiency.

Specific examples of the rings $A^4$ and $A^5$ which form the ligands of the above formula include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenyl and 3-trifluoromethylphenoxy; substituted or unsubstituted alkylthio groups such as methythio, ethylthio, tert-butylthio, hexylthio, octylthio and trifruoromethylthio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group, an amino group; mono or di-substituted amino groups such as methylamino, dimethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl. Moreover the above-mentioned substituents may be bonded to each other to form a six-membered aryl or heterocyclic ring.

A reducing dopant may be contained in an electron transporting region or an interface region between a cathode and an organic layer. The reducing dopant here is defined as a substance which can reduce electron transporting compounds. Various substances having a certain reducibility can be used. The following can be preferably used: at least one substance selected from alkaline metals, alkaline earth metals, rare earth metals, oxides of alkaline metals, halides of alkaline metals, oxides of alkaline earth metals, halides of alkaline earth metals, oxides of rare earth metals, halides of rare earth metals, organic complexes of alkaline metals, organic complexes of alkaline earth metals and organic complexes of rare earth metals.

Preferable examples of the reducing dopant are at least one alkaline metal selected from Na (work function: 2.36 eV), K (work function: 2.28 eV), Rb (work function: 2.16 eV) and Cs (work function: 1.95 eV) or at least one alkaline earth metal selected from Ca (work function: 2.9 eV), Sr (work function: 2.0 to 2.5 eV) and Ba (work function: 2.52 eV). More preferred are ones having a work function of 2.9 eV or less. Among these, a more preferable reducing dopant is at least one alkaline metal selected from K, Rb and Cs, even more preferably Rb and Cs and the most preferably Cs. These alkaline metals have a particularly high reducing ability, and therefore adding a relatively small amount thereof into an electron injecting region enhances the luminance and lifetime of the organic EL device. As a reducing dopant having a work function of 2.9 eV or less, combinations of two or more of these alkaline metals are preferable. Combinations with Cs, for example, Cs and Na, Cs and K, Cs and Rb or Cs, Na and K are particularly preferable. The combination with Cs efficiently exhibits a reducing ability and the addition thereof into an electron injecting region enhances the luminance and the lifetime of the organic EL device.

In the invention, an electron-injecting layer formed of an insulator or a semiconductor may further be provided between a cathode and an organic layer. By providing the layers, current leakage can be effectively prevented to improve the injection of electrons. As the insulator, at least one metal compound selected from alkaline metal calcogenides, alkaline earth metal calcogenides, halides of alkaline metals and halides of alkaline earth metals can be preferably used. If an electron-injecting layer is formed of these compounds, the injection of electrons can be preferably improved. Specifically preferable alkaline metal calcogenides include $Li_2O$, LiO, $Na_2S$, $Na_2Se$ and NaO and preferable alkaline earth metal calcogenides include CaO, BaO, SrO, BeO, BaS and CaSe. Preferable halides of alkaline metals include LiF, NaF, KF, LiCl, KCl and NaCl. Preferable halides of alkaline earth metals include fluorides such as $CaF_2$, $BaF_2$, $SrF_2$, $MgF_2$ and $BeF_2$ and halides other than fluorides.

Examples of the semiconductor include oxides, nitrides or oxynitrides containing at least one element selected from Ba, Ca, Sr, Yb, Al, Ga, In, Li, Na, Cd, Mg, Si, Ta, Sb and Zn, and combinations of two or more thereof. The inorganic compound of which the electron-transporting layer is made is preferably a microcrystalline or amorphous insulating thin film. If an electron-transporting layer is formed of the insulating thin film, a more uniform thin film can be formed to reduce pixel defects such as dark spots. Examples of such an inorganic compound include the above-mentioned alkali metal calcogenides, alkaline earth metal calcogenides, halides of alkali metals, and halides of alkaline earth metals.

The thickness of electron injecting or transporting layer is not particularly limited but preferably 1 to 100 nm.

The blue emitting layer or the first organic layer preferably contains an oxidant. Preferable oxidants are electron attractors or electron acceptors. Examples thereof include Lewis acids, various quinone derivatives, dicyanoquinodimethane derivatives, and salts of aromatic amines and Lewis acids. Particularly preferred Lewis acids include iron chloride, antimony chloride and aluminum chloride.

The yellow-to-red emitting layer or the second organic layer preferably contains a reducing agent. Preferable reducing agents are alkaline metals, alkaline earth metals, oxides of alkaline metals, oxides of alkaline earth metals, oxides of rare earth metals, halides of alkaline metals, halides of alkaline earth metals, halides of rare earth metals, and complexes formed of alkaline metals and aromatic compounds. Particularly preferred alkaline metals are Cs, Li, Na and K.

4. Inorganic Compound Layer

There may be provided an inorganic compound layer(s) in contact with an anode and/or a cathode. The inorganic compound layer functions as an adhesion improving layer. Preferable inorganic compounds used for the inorganic compound layer include alkaline metal oxides, alkaline earth oxides, rare earth oxides, alkaline metal halides, alkaline earth halides, rare earth halides, and various oxides, nitrides and nitric oxides such as $SiO_x$, $AlO_x$, $SiN_x$, SiON, AlON, $GeO_x$, $LiO_x$, LiON, $TiO_x$, TiON, $TaO_x$, TaON, $TaN_x$ and C. As a component of layer in contact with an anode, $SiO_x$, $AlO_x$, $SiN_x$, SiON, AlON, $GeO_x$ and C are preferable, since they can form a stable injecting interface layer. As a component of layer in contact with a cathode, LiF, $MgF_2$, $CaF_2$, $MgF_2$ and NaF are preferable.

The thickness of the inorganic compound layer is not particularly limited, and is preferably from 0.1 nm to 100 nm.

Methods of forming various organic layers including an emitting layer and inorganic compound layer are not particularly limited. For example, known methods such as deposition, spin coating, casting, and LB technique can be applied. The electron-injecting layer and emitting layer are preferably formed by the same method, because this makes the properties of the organic EL devices obtained constant and the production time can be shortened. For example, when the electron-injecting layer is formed by deposition, the emitting layer also is preferably formed by deposition.

5. Electrodes

For the anode, the following is preferably used: metals, alloys or electric conductive compounds, or mixtures thereof that have a large work function (e.g., 4.0 eV or more). Specific examples are indium tin oxide (ITO), indium zinc oxide, tin, zinc oxide, gold, platinum, and palladium. They can be used individually or as a combination of 2 or more kinds.

The thickness of the anode is preferably from 10 to 1,000 nm, more preferably from 10 to 200 nm.

For the cathode, the following is preferably used: metals, alloys or electric conductive compounds, or a mixture thereof that have a small work function (e.g., less than 4.0 eV). Specific examples include magnesium, aluminum, indium, lithium, sodium, and silver. They can be used individually or as a combination of 2 or more kinds.

The thickness of the cathode is preferably from 10 to 1,000 nm, more preferably from 10 to 200 nm.

It is preferred that at least one of the anode and the cathode be substantially translucent, more specifically, have a light transmission of 10% or more, in order to effectively take out light emitted from an emitting layer to the outside.

The electrodes can be formed by vacuum deposition, sputtering, ion plating, electron beam deposition, CVD, MOCVD, plasma CVD and so on.

EXAMPLES

Examples of the invention will be explained below, but the invention is not limited to the following examples. Organic EL devices obtained in the examples were evaluated as follows.

(1) Initial performance: Chromaticity was measured and evaluated using CIE1931 chromaticity coordinates.

(2) Luminous efficiency: A certain voltage was applied to a device and luminance was measured with CS-1000 (manufactured by MINOLTA Co., Ltd.) At the same time, a current was measured with an ammeter (manufactured by KEITHLEY). Luminous efficiency was calculated from the luminance and current value obtained.

(3) Ionization potential (abbreviated to "IP" hereinafter): IP was measured with AC-1 (manufactured by Riken Keiki Co., Ltd.).

(4) Affinity level (abbreviated to "Af" hereinafter): Calculated on the basis of the following equation.

$$Af=IP-Eg$$

wherein Eg is an optical band gap calculated from ultraviolet-visible absorption spectrum.

Example 1

Fabrication of Organic EL Device

A grass substrate measuring 25 mm by 75 mm by 1.1 mm with an ITO transparent electrode (GEOMATEC CO., LTD.) was subjected to ultrasonic cleaning with isopropyl alcohol for 5 minutes, and cleaned with ultraviolet rays and ozone for 30 minutes.

The resultant substrate was mounted on a substrate holder in a vacuum deposition device. First, a film of N,N'-bis(N,N'-diphenyl-4-aminophenyl)-N,N'-diphenyl-4,4'-diamino-1,1'-biphenyl (TPD232 film), having a thickness of 60 nm, was formed so as to cover the surface of the transparent electrode on which transparent electrode lines were formed. The TPD232 film functioned as a hole-injecting layer.

After forming the TPD232 film, a layer of 4,4'-bis[N-(1-naphthyl)-N-phenylamino]biphenyl film (NPD film), having a thickness of 20 nm, was formed on the TPD232 film. The NPD film functioned as a hole-transporting layer. The structures of TPD232 and NPD are shown below.

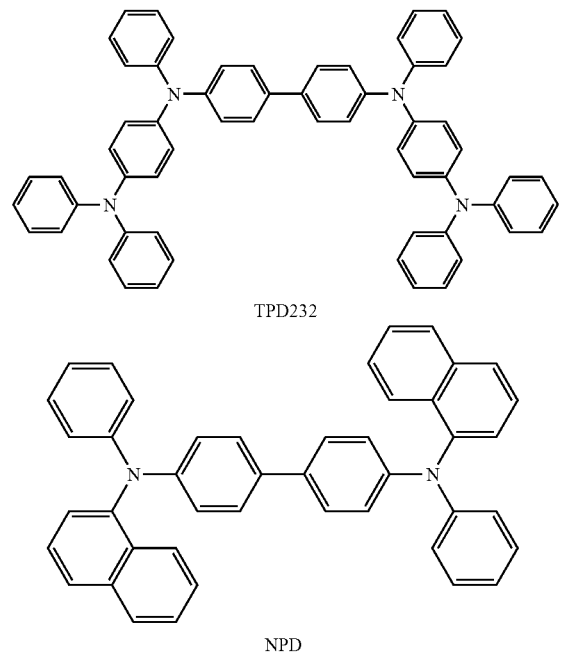

TPD232

NPD

Further, after forming the NPD film, a styryl derivative represented by formula [32] and R1 (fluorescent peak wavelength: 545 nm) represented by formula [34] were deposited to a thickness of 10 nm at a weight ratio of 40:2 to form a yellow-to-red emitting layer (a first emitting layer).

Next, a 5 nm thick PBD film was formed. The PBD film functioned as a hole barrier layer.

Next, the styryl derivative represented by formula [35] and B1 represented by formula [33] were deposited to a thickness of 30 nm at a weight ratio of 40:2 to form a blue emitting layer (a second emitting layer).

A 10 nm thick tris(8-quinolinol)aluminum film (Alq film) was formed thereon as an electron transporting layer.

Thereafter lithium (lithium source: Saes getter Co., Ltd.) and Alq were co-deposited to form a 10 nm thick Alq:Li film as an electron-injecting layer. Metal Al was deposited on this Alq:Li film in a thickness of 150 nm to form a metallic cathode, thereby forming an organic EL device. The device emitted light with a chromaticity of (0.29, 0.29), that is, white and had a high luminous efficiency.

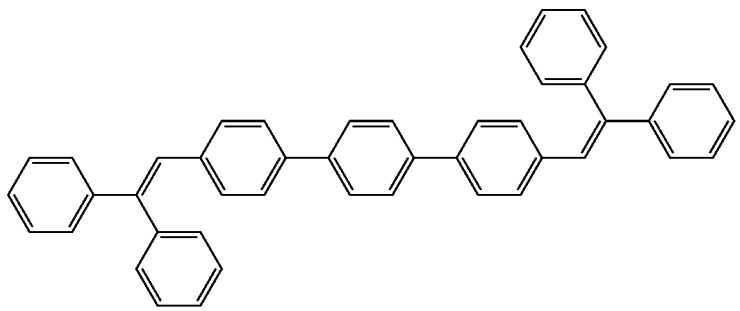

[32]

-continued
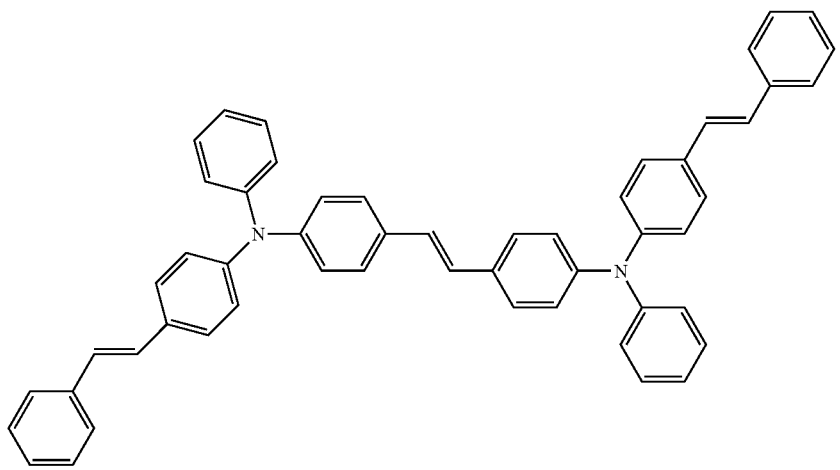
[33]
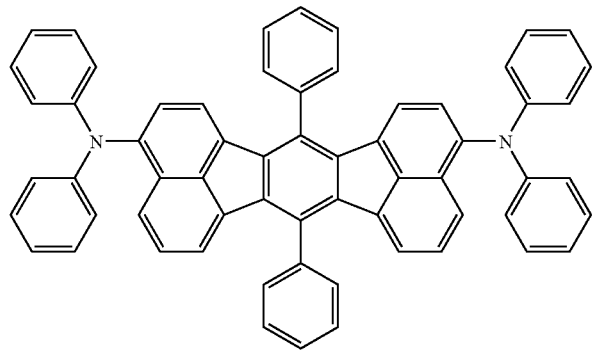
[34]
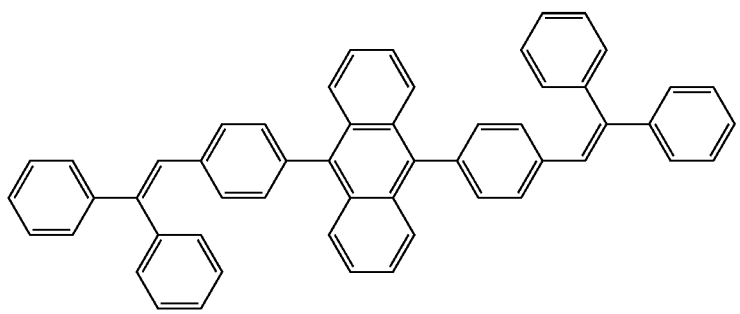
[35]
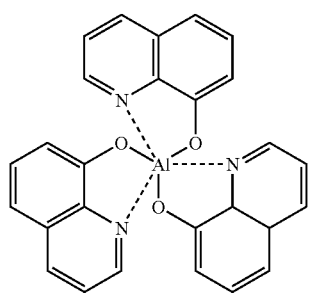
[Alq]
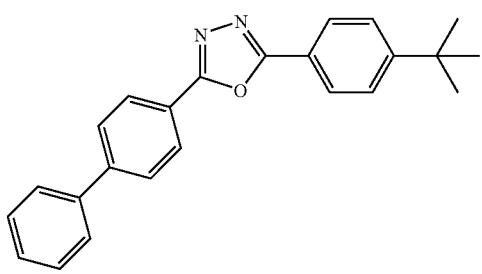
[PBD]

Comparative Example 1

A device was fabricated by the same method as in Example 1. However, the second emitting layer was formed on the first emitting layer, and the hole emitting layer was not formed. The device emitted light with a chromaticity of (0.50, 0.42), that is, yellow, not white.

Comparative Example 2

A device was fabricated by the same method as in Example 1. However, the second emitting layer was formed on the first emitting layer, and the hole barrier layer was not formed. B1 was used instead of R1 in the first emitting layer and R1 was used instead of B1 in the second emitting layer. The device emitted light with a chromaticity of (0.28, 0.28), that is, white, but the luminous efficiency was low.

Table 1 shows IP and Af, chromaticity (at 100 cd/m² hour) and luminous efficiency (at 100 cd/m² hour) of the emitting layer and the hole barrier layer of Example 1, Comparative Example 1 and Comparative Example 2.

TABLE 1

| | IP/Af of first emitting layer (eV) | IP/Af of hole barrier layer (eV) | IP/Af of second emitting layer (eV) | Chromaticity* | Emission Color | Luminous* Efficiency (cd/A) |
|---|---|---|---|---|---|---|
| Example 1 | 5.9/2.9 (fromula 32:R1) | 6.2/2.9 (PBD) | 5.7/2.9 (fromula 35:B1) | (0.29, 0.29) | white | 9.2 |
| Comparative Example 1 | 5.9/2.9 (fromula 32:R1) | | 5.7/2.9 (fromula 35:B1) | (0.52, 0.42) | yellow | 8.5 |
| Comparative Example 2 | 5.9/2.9 (fromula 32:B1) | | 5.7/2.9 (fromula 35:R1) | (0.28, 0.28) | white | 6.0 |

*at 100 cd/m² hour

Example 2

Fabrication of Organic EL Device

A grass substrate measuring 25 mm by 75 mm by 1.1 mm with an ITO transparent electrode (GEOMATEC CO., LTD.) was subjected to ultrasonic cleaning with isopropyl alcohol for 5 minutes, and cleaned with ultraviolet rays and ozone for 30 minutes.

The resultant substrate was mounted on a substrate holder in a vacuum deposition device. First, a TPD232 film having a thickness of 10 nm, was formed so as to cover the surface of the transparent electrode on which transparent electrode lines were formed. The TPD232 film functioned as a hole-injecting layer.

After forming the TPD232 film, a layer of NPD film, having a thickness of 50 nm, was formed on the TPD232 film. The NPD film functioned as a hole transporting layer.

Further, after forming the NPD film, a carbazole derivative represented by formula [38] and an iridium complex represented by formula [36] were deposited to a thickness of 50 nm at a weight ratio of 50:4 to form a blue emitting layer (a first emitting layer).

Next, a 5 nm thick BCP film was formed. The BCP film functioned as a hole barrier layer.

Next, the carbazole derivative represented by formula [38] and an iridium complex represented by formula [37] were deposited to a thickness of 30 nm at a weight ratio of 30:3 to form a yellow-to-red emitting layer (a second emitting layer).

A 10 nm thick BAlq film was formed thereon as an electron transporting layer.

Thereafter lithium (lithium source: Saes getter Co., Ltd.) and Alq were co-deposited to form a 10 nm thick Alq:Li film as an electron injecting layer. Metal Al was deposited on this Alq:Li film in a thickness of 150 nm to form a metallic cathode, thereby forming an organic EL device.

The device emitted light with a luminance of 100 cd/m², luminous efficiency of 20.1 cd/A, and chromaticity of (0.33, 0.38) when applied by a direct voltage of 11 V. White light could be obtained in a high efficiency.

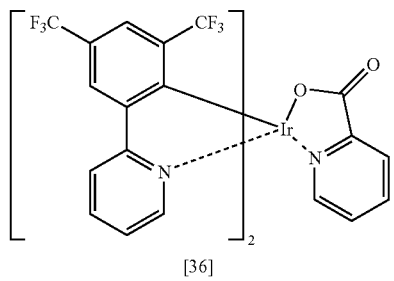

[36]

-continued

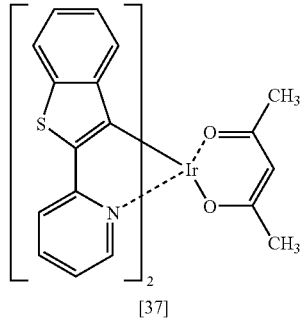

[37]

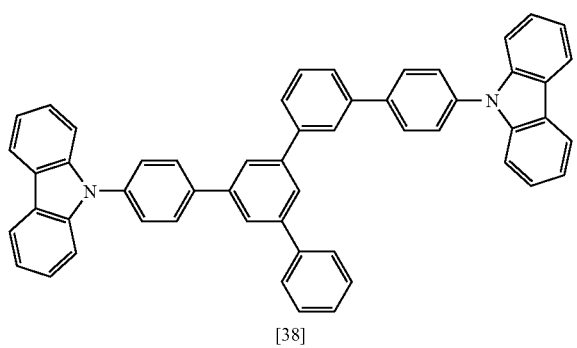

[38]

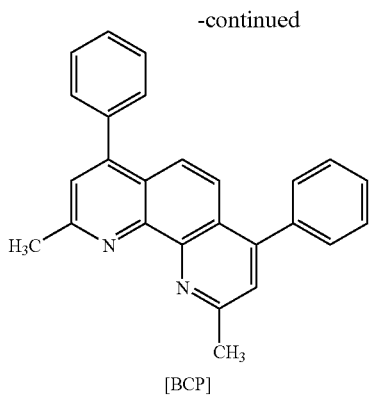
[BCP]

Table 2 shows IP and Af, chromaticity (at 100 cd/m² hour) and luminous efficiency (at 100 cd/m² hour) of the emitting layer and the hole barrier layer of Example 2.

TABLE 2

| | IP/Af of first emitting layer (eV) | IP/Af of hole barrier layer (eV) | IP/Af of second emitting layer (eV) | Chromaticity* | Emission Color | Luminous* Efficiency (cd/A) | Driving* voltage (V) |
|---|---|---|---|---|---|---|---|
| Example 2 | 5.8/2.6 (fromula 38:formula 36) | 6.2/2.6 (PBD) | 5.8/2.6 (fromula 38:formula 37) | (0.33, 0.38) | white | 20.1 | 11 |

*at 100 cd/m² hour

INDUSTRIAL UTILITY

The organic EL device of the invention has high luminous efficiency and has little change in chromaticity, so that it can be applied to various displays (such as commercial and industrial displays, specifically, various mono-color or full color displays such as a cellular phone, PDA, an automobile navigation system, TV, etc.), various illumination (backlight, etc.) and the like.

The invention claimed is:

1. An organic electroluminescent device comprising, in order:
an anode;
a first emitting layer;
a hole barrier layer;
a second emitting layer; and
a cathode;
wherein:
the first emitting layer and the second emitting layer both comprise a hole transporting material;
a difference in affinity level between the hole barrier layer and the first emitting layer is 0.2 eV or less;
a difference in affinity level between the hole barrier layer and the second emitting layer is 0.2 eV or less;
affinity levels of the hole barrier layer, the first emitting layer and the second emitting layer are determined using ionization potential values obtained with a photoelectron spectrometer at atmospheric pressure with a UV source.

2. The organic electroluminescent device according to claim 1, wherein the first emitting layer and the second emitting layer both have a hole mobility of $10^{-5}$ cm²/Vs or more.

3. The organic electroluminescent device according to claim 1, wherein the ionization potential of the hole barrier layer is higher than the ionization potential of the first emitting layer by 0.2 eV or more.

4. The organic electroluminescent device according to claim 1, wherein the first emitting layer is a blue emitting layer.

5. The organic electroluminescent device according to claim 1, wherein the second emitting layer is a yellow-to-red emitting layer.

6. The organic electroluminescent device according to claim 1, wherein the first emitting layer is a yellow-to-red emitting layer.

7. The organic electroluminescent device according to claim 1, wherein the second emitting layer is a blue emitting layer.

8. The organic electroluminescent device according to claim 1 that emits white light.

9. A display comprising the organic electroluminescent device according to claim 1.

10. The organic electroluminescent device according to claim 1, wherein the low-energy photoelectron counter is a Riken-Keiki AC-1.

* * * * *